US011244844B2

(12) United States Patent
Reuter et al.

(10) Patent No.: US 11,244,844 B2
(45) Date of Patent: Feb. 8, 2022

(54) HIGH FLOW VELOCITY, GAS-PURGED, SIDE STORAGE POD APPARATUS, ASSEMBLIES, AND METHODS

(71) Applicant: Applied Materials, Inc., Santa Clara, CA (US)

(72) Inventors: Paul B. Reuter, Austin, TX (US); Murali Narasimhan, San Jose, CA (US); Amulya L. Athayde, Palo Alto, CA (US); Patrick Pannese, San Jose, CA (US); Dean C. Hruzek, Cedar Park, TX (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 16/657,685

(22) Filed: Oct. 18, 2019

(65) Prior Publication Data
US 2020/0135521 A1     Apr. 30, 2020

Related U.S. Application Data

(60) Provisional application No. 62/751,506, filed on Oct. 26, 2018.

(51) Int. Cl.
   *H01L 21/673*     (2006.01)
   *H01L 21/677*     (2006.01)
   *H01L 21/67*      (2006.01)

(52) U.S. Cl.
   CPC .. *H01L 21/67389* (2013.01); *H01L 21/67017* (2013.01); *H01L 21/67167* (2013.01);
   (Continued)

(58) Field of Classification Search
   CPC ......... H01L 21/67389; H01L 21/67017; H01L 21/67769; H01L 21/67393;
   (Continued)

(56) References Cited

U.S. PATENT DOCUMENTS 9,105,673 B2 *  8/2015  Babbs .............. H01L 21/67213
9,524,892 B2 * 12/2016  Rebstock .......... H01L 21/67766
   (Continued)

FOREIGN PATENT DOCUMENTS

JP   2015-146349 A   8/2015
JP   2017-011150 A   1/2017
   (Continued)

OTHER PUBLICATIONS

International Search Report and Written Opinion for International Application No. PCT/US2019/057650, 12 pages, dated Feb. 12, 2020.
   (Continued)

*Primary Examiner* — Nicolas A Arnett
(74) *Attorney, Agent, or Firm* — Lowenstein Sandler LLP (57) ABSTRACT

In some embodiments, a side storage pod apparatus of an equipment front end module (EFEM) includes a side storage enclosure having a surface configured to couple to a side wall of a body of the equipment front end module, and an opening configured to receive substrates from the equipment front end module. The EFEM further includes a side storage chamber within the side storage enclosure having a plurality of support members configured to support substrates thereon. The EFEM further includes a plenum chamber provided proximate the side storage chamber, the plenum chamber being a separate chamber from the side storage chamber and an exhaust port coupled to the plenum chamber.

25 Claims, 7 Drawing Sheets

(52) U.S. Cl.
CPC .. *H01L 21/67383* (2013.01); *H01L 21/67393* (2013.01); *H01L 21/67769* (2013.01); *B01D 2253/102* (2013.01); *H01L 21/67196* (2013.01); *H01L 21/67766* (2013.01)

(58) Field of Classification Search
CPC ......... H01L 21/67766; H01L 21/68707; H01L 21/67775; H01L 21/67778; H01L 21/67772; H01L 21/67383; H01L 21/67167; H01L 21/67196
See application file for complete search history.

(56) References Cited

U.S. PATENT DOCUMENTS

| | | | |
|---|---|---|---|
| 10,192,765 B2* | 1/2019 | Koshti | H01L 21/67772 |
| 10,359,743 B2* | 7/2019 | Rice | H01L 21/67775 |
| 10,522,379 B2* | 12/2019 | Kong | H01L 21/67393 |
| 10,566,216 B2* | 2/2020 | Senn | H01L 21/67739 |
| 10,763,134 B2* | 9/2020 | Rice | H01L 21/67769 |
| 10,777,437 B2* | 9/2020 | Fukasawa | H01L 21/67017 |
| 2011/0114129 A1* | 5/2011 | Kishkovich | H01L 21/67017 134/22.1 |
| 2015/0101482 A1* | 4/2015 | Chou | B01D 46/442 95/12 |
| 2015/0170945 A1* | 6/2015 | Segawa | H01L 21/67772 414/217 |
| 2015/0228518 A1 | 8/2015 | Hyon | |
| 2016/0118279 A1 | 4/2016 | Tyer et al. | |
| 2016/0118282 A1* | 4/2016 | Maraschin | H01L 21/67393 414/222.07 |
| 2016/0284580 A1* | 9/2016 | Woo | H01L 21/67393 |
| 2016/0379855 A1 | 12/2016 | Fukasawa | |
| 2017/0011942 A1* | 1/2017 | Woo | H01L 21/67724 |
| 2017/0125272 A1 | 5/2017 | van Gogh et al. | |
| 2017/0170042 A1* | 6/2017 | Okabe | H01L 21/67017 |
| 2018/0114710 A1* | 4/2018 | Jeong | H01L 21/673 |
| 2018/0124960 A1* | 5/2018 | Vincent | H01L 21/67201 |
| 2018/0286726 A1* | 10/2018 | Rebstock | H01L 21/67389 |
| 2018/0374725 A1* | 12/2018 | Holeyannavar | H01L 21/67201 |
| 2018/0374733 A1* | 12/2018 | Pannese | H01L 21/67769 |
| 2019/0287922 A1 | 9/2019 | Woo | |
| 2019/0326134 A1 | 10/2019 | Suzuki et al. | |
| 2020/0135499 A1* | 4/2020 | Pannese | B01D 46/0039 |
| 2020/0135520 A1* | 4/2020 | Reuter | H01L 21/67017 |
| 2020/0135521 A1* | 4/2020 | Reuter | H01L 21/67389 |
| 2020/0135522 A1 | 4/2020 | Reuter et al. | |
| 2020/0135523 A1* | 4/2020 | Reuter | H01L 21/67389 |
| 2020/0135525 A1* | 4/2020 | Reuter | H01L 21/67393 |
| 2020/0350193 A1* | 11/2020 | Garssen | H01L 21/67769 |

FOREIGN PATENT DOCUMENTS

| | | |
|---|---|---|
| KR | 10-1215962 B1 | 12/2012 |
| KR | 10-1637498 B1 | 7/2016 |
| KR | 10-1682473 B1 | 12/2016 |
| KR | 10-2018-0074276 A | 7/2018 |

OTHER PUBLICATIONS

International Search Report and Written Opinion for International Application No. PCT/US2019/057646, 12 pages, dated Feb. 17, 2020.

* cited by examiner

HIGH FLOW VELOCITY, GAS-PURGED, SIDE STORAGE POD APPARATUS, ASSEMBLIES, AND METHODS

REFERENCE TO EARLIER FILED APPLICATION

This application claims the benefit under 35 U.S.C. § 119(e) of U.S. Provisional Patent Application No. 62/751,506, filed Oct. 26, 2018, which is incorporated herein, in its entirety, by this reference.

TECHNICAL FIELD

The present application relates to electronic device manufacturing, and more specifically to side storage pod apparatus of equipment front end modules (EFEMs), EFEM assemblies including a side storage pod apparatus, and methods.

BACKGROUND

Processing of substrates in semiconductor component manufacturing is carried out in multiple process tools, where the substrates travel between the process tools in substrate carriers (e.g., Front Opening Unified Pods or FOUPs). The FOUPs may be docked to a front wall of an EFEM that includes a load/unload robot that is operable to transfer substrates between the respective FOUPs and one or more destinations (e.g., load lock(s) or a process chamber(s)) coupled to a rear wall of the EFEM opposite the front wall. In order to protect the substrates from contamination/corrosion while in transit through the EFEM, the environment within the EFEM may be controlled, such as by injecting a suitable amount of a non-reactive gas (e.g., $N_2$) therein. In some cases, the EFEM includes a side storage pod apparatus coupled to a side wall thereof that is used to store substrates that are returning from processing in the processing chamber(s), possibly for cooling, for example. However, in some instances, existing EFEMs and side storage pod apparatus thereof suffer from certain limitations.

SUMMARY

In some embodiments, a side storage pod apparatus of an equipment front end module is provided. The side storage pod apparatus may include a side storage enclosure having a surface configured to couple to a side wall of an equipment front end module body of the equipment front end module, and an opening configured to receive substrates from the equipment front end module. A side storage chamber within the side storage enclosure may include a plurality of support members configured to support substrates thereon, a plenum chamber provided proximate the side storage chamber, the plenum chamber being a separate chamber from the side storage chamber, and an exhaust port coupled to the plenum chamber. The exhaust may be removed from the side storage pod apparatus and not recirculated to an EFEM chamber of the EFEM.

In some embodiments, an equipment front end module is provided. The equipment front end module may include an equipment front end module body and a side storage pod apparatus coupled to a side wall of the equipment front end module body. The side storage pod apparatus may include: a side storage pod enclosure having a surface configured to couple to a side wall of the equipment front end body, a side storage pod chamber within the enclosure having a plurality of vertically-spaced storage members each configured to support a substrate, a plenum chamber within the enclosure including a separate chamber from the side storage pod chamber, a baffle plate configured to separate the plenum chamber from the side storage pod chamber, and an exhaust port coupled to the plenum chamber.

In some embodiments, an electronic device processing assembly is provided. The electronic device processing assembly includes an equipment front end module. The equipment front end module may include: an equipment front end module body forming an equipment front end module chamber; one or more load ports coupled to a front wall of the equipment front end module body, each load port configured to dock a substrate carrier thereat; and a side storage pod apparatus coupled to a side wall of the equipment front end module body. The side storage pod apparatus may include: a side storage enclosure defining chamber walls of a side storage pod chamber, and having a sealing surface configured to couple to the equipment front end module body. The chamber walls may include a plurality of vertically-spaced support members configured to support substrate thereon, a plenum chamber within the side storage enclosure having a separate chamber from the side storage pod chamber, a baffle plate configured to separate the plenum chamber from the side storage pod chamber, an exhaust port, an exhaust conduit coupled to the exhaust port, and a supplemental fan coupled to the exhaust port or the exhaust conduit.

In some embodiments, a method of processing substrates, such as within an EFEM having a side storage pod apparatus is provided. The method may include providing an equipment front end module including an equipment front end module body and an equipment front end module chamber. The equipment front end module may include one or more load ports coupled to a front wall of the equipment front end module body, each load port configured to dock a substrate carrier, and a side storage pod apparatus coupled to a side wall of the equipment front end module body. The method may further include providing, in the side storage pod, a side storage pod chamber and a plenum chamber separated by a baffle plate, and an exhaust port coupled to the plenum chamber. The method may further include flowing a purge gas across substrates stored in the equipment front end module chamber, through the baffle plate, and into the plenum chamber. The method may further include exhausting the purge gas from the plenum chamber through the exhaust port.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF THE DRAWINGS

The drawings, described below, are for illustrative purposes only and are not necessarily drawn to scale. The drawings are not intended to limit the scope of the disclosure in any way.

DETAILED DESCRIPTION

Reference will now be made in detail to the example embodiments provided, which are illustrated in the accompanying drawings. Wherever possible, the same or similar reference numbers will be used throughout the drawings to refer to the same or similar parts. Features of the various embodiments described herein may be combined with each other, unless specifically noted otherwise.

Substrates processed in existing electronic device manufacturing assemblies may suffer from problems when exposed to high humidity or other environmental factors (e.g., too high of an oxygen ($O_2$) level, or relatively high levels of other chemical contaminants). In particular, exposure of substrates to relatively high humidity levels, relatively high $O_2$ levels, or other chemical contaminants may adversely affect substrate properties in some cases. As such, the environment within the EFEM may be controlled to a predefined low exposure level, such as a low relative humidity level. In particular, such low relative humidity environment may introduce other concerns. For example, the relatively low humidity may make it difficult to remove certain chemical contaminants from the surface of the substrate after processing in the processing chamber(s). For example, chemical contaminants such as halogen-containing components (e.g., chlorine, bromine, fluorine, and the like may be adhered to the surface of the substrate and may be quite difficult to disassociate in such low relative humidity environments.

In order to alleviate these concerns, purge gas flow through the side storage pod apparatus is provided. For example, purge gas flow may be provided of greater than or equal to 100 cubic feet per minute (cfm), greater than or equal to 120 cfm, greater than or equal to 140 cfm, greater than or equal to 160 cfm, or even higher, such as greater than or equal to 180 cfm. For example, purge gas flow through the side storage pod apparatus may be greater than or equal to 100 cfm and less than or equal to 200 cfm. In other embodiments, purge gas flow through the side storage pod apparatus may be greater than or equal to 150 cfm and less than or equal to 200 cfm.

Thus, according to one or more embodiments of this disclosure, electronic device processing assemblies including an EFEM with environmental controls (e.g., as part of an environmental control assembly) are provided further including side storage pod apparatus with gas purge capability. Thus, certain undesirable chemical contaminants may be effectively removed from the substrates following processing in the processing chamber(s). This allows any volatile byproducts present within the side storage pod chamber or located on surfaces of the substrates stored with the side storage pod chamber to be effectively reduced and/or removed. Further, the purge capability of the side storage pod apparatus may reduce cross contamination between the side storage pod chamber and the EFEM chamber during substrate transfers processing.

The apparatus, assemblies, and methods described herein may provide efficiency and/or processing improvements in the processing of substrates by controlling environmental conditions to which the substrates are exposed to when in transit through the EFEM, but also when resident within the side storage pod apparatus.

In the described embodiments, the EFEM receives substrates from one or more substrate carriers that are docked to a load port on a front wall thereof (e.g., docked to a load port configured on a front wall of the EFEM body). An end effector of a load/unload robot located in an EFEM chamber formed at least in part by an EFEM body delivers the substrates to one or more load locks or process chambers coupled on another surface of the EFEM (e.g., a rear surface thereof) for transfer into a mainframe containing processing chambers for processing.

In some embodiments, one or more environmental conditions (e.g., a relative humidity (RH), an amount of $O_2$, an amount of flow of a purge gas (e.g., non-reactive or inert) into the EFEM chamber, a pressure, a temperature, or an amount of any chemical contaminant) may be monitored and controlled in the EFEM chamber. None of the FOUPs docked to the load ports of the EFEM body may be opened unless certain pre-conditions regarding the environmental conditions in the EFEM chamber are met.

In one or more embodiments herein, an environmentally-controlled side storage pod apparatus is provided. The side storage pod apparatus may be environmentally controlled by introducing a flow of purge gas there through, thus exposing the substrates stored therein to a purge gas flow. For example, in some embodiments, the side storage pod apparatus may include a side storage pod chamber that allows storage of 25 or more substrates, or even 50 or more substrates therein. In some embodiments, the side storage apparatus may include multiple side storage containers therein that may be removable/exchangeable. In one or more embodiments, the purge gas may be a non-reactive or inert gas that may be provided to the side storage pod chamber from the EFEM chamber so that any substrates stored therein may have been exposed to a reactive or contaminant gas during processing may be appropriately degassed and the unwanted contaminants disassociated therefrom.

The side storage pod apparatus may include a side pod storage chamber and a plenum chamber that are separated by a suitable perforated partition, such as by a baffle plate. The baffle plate may include a series of flow passages formed therein. The flow passages may include variable cross-sectional sizes (e.g., diameters) and thus different cross-sectional areas through the baffle plate. The flow passages may be arranged so that a desired flow pattern or flow profile is provided within the side storage pod chamber. In particular it is desired to a achieve a substantially uniform flow velocity (V) at all of the storage locations within the side storage pod chamber that may contain substrates and further to achieve a predefined minimum flow velocity therein as discussed above to aid in disassociating any chemical contaminants thereon.

Purge gas flow through the side storage pod chamber may be in through a side storage pod opening coupled to a side wall opening of the EFEM body. The opening may remain open at all times, giving the load/unload robot instant access to the substrate storage locations in the side storage pod apparatus. Flow out of side storage pod chamber may be through the baffle plate, into a plenum chamber, and out through an exhaust port, wherein the exhaust gas flow may be sent exterior to the EFEM. For example, the exhaust flow could be sent to a suitable exhaust treatment apparatus, such as a chemical filter, an absorbent bed, or other suitable exhaust scrubbing technology. In this manner, non-reactive purge gas may flow through the EFEM chamber, into the side storage pod chamber, over any substrates stored therein, into the plenum chamber, and out of the side storage pod apparatus via the exhaust port. This allows any chemical contaminants that may be resident on the substrates to be disassociated and removed from the substrates, and removed from the side storage pod apparatus and EFEM where they may be properly disposed of and not re-contaminate the substrates. The flow rates through the side storage pod chamber may advantageously be controlled in some embodiments to achieve an acceptable rate of removal of the unwanted contaminants.

Further details of example side storage pod apparatus, EFEM assemblies including side storage pod apparatus, and methods of processing substrates provided in a side storage pod apparatus are further described with reference to FIGS. 1-4 herein.

Figure 1:
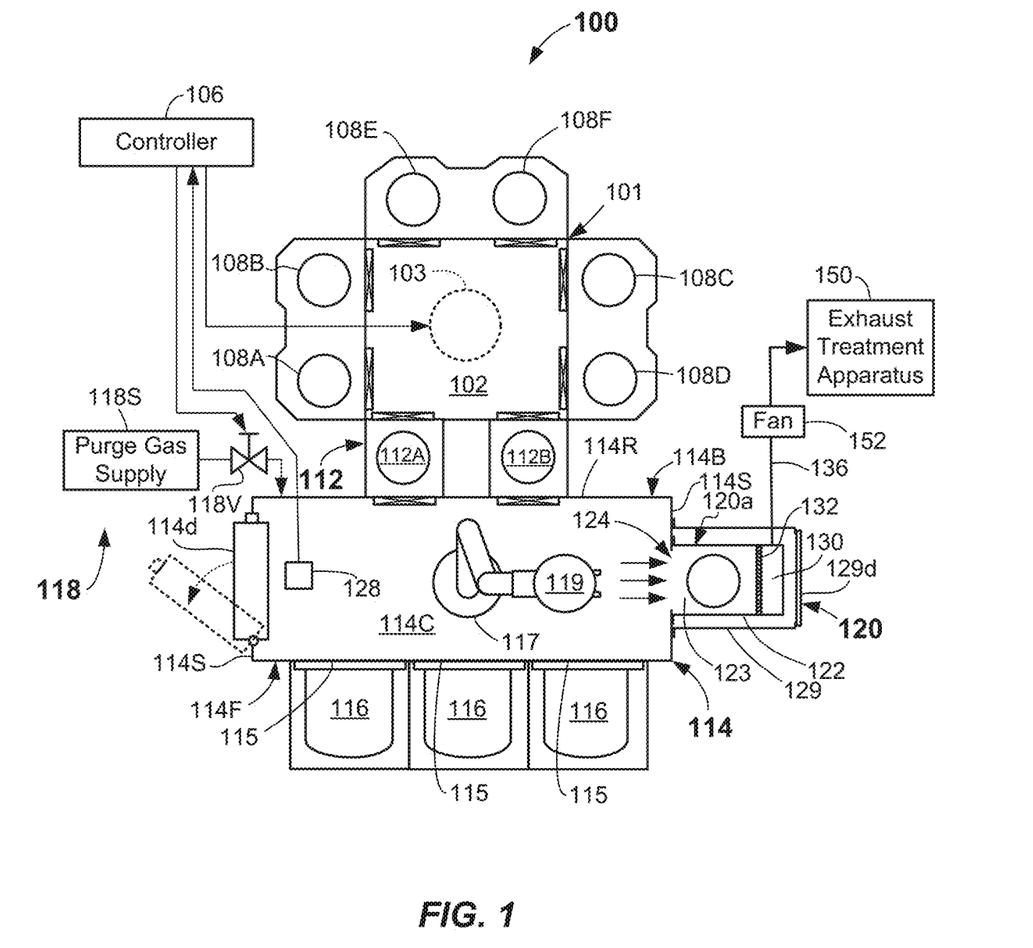
FIG. 1 illustrates a schematic top view of an electronic device processing assembly including an EFEM including a side storage pod apparatus coupled to a side wall of EFEM body according to the disclosure.
Figure 3A:
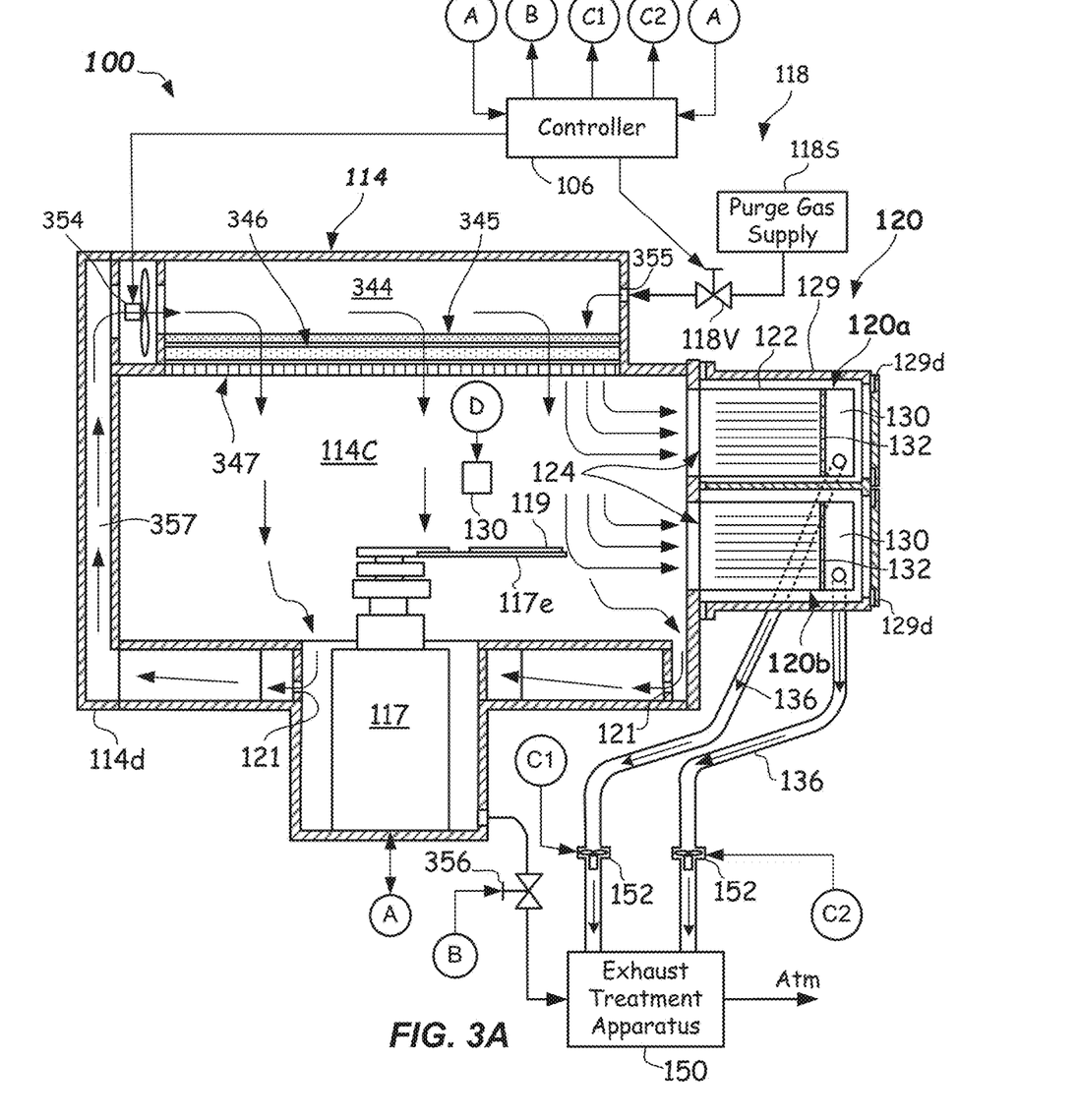
FIG. 3A illustrates a side schematic view of an EFEM including a side storage pod apparatus and illustrating purge gas flow and recirculation gas flow patterns according to one or more embodiments of the disclosure.
Figure 3B:
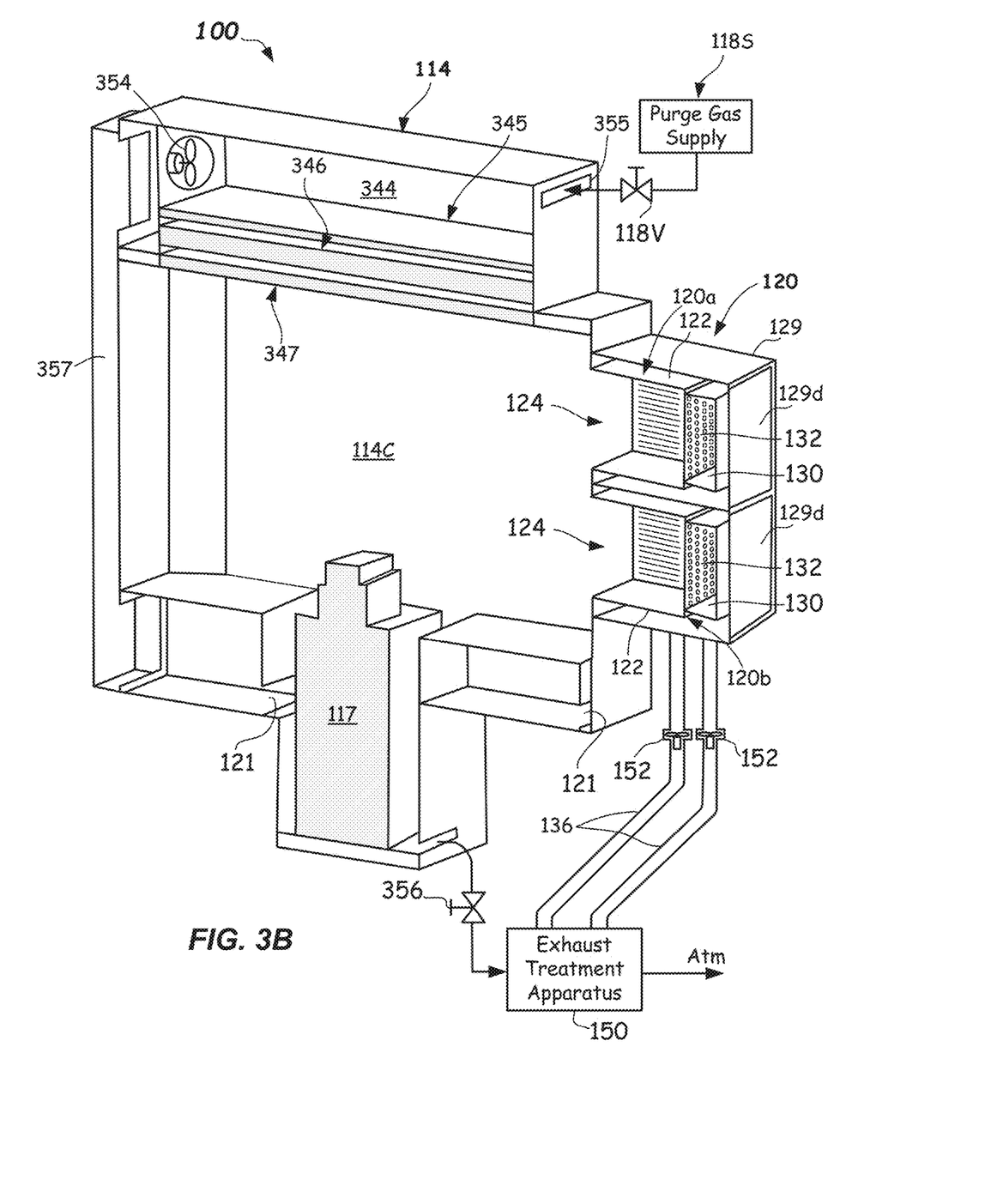
FIG. 3B illustrates a partial perspective view of an EFEM including a side storage pod apparatus according to one or more embodiments of the disclosure.

FIG. 1 and FIGS. 3A-3B illustrate schematic diagrams of an example embodiment of an electronic device processing assembly 100 according to one or more embodiments of the present disclosure. The electronic device processing assembly 100 may include a mainframe 101 having mainframe walls defining a transfer chamber 102. A transfer robot 103 (shown as a dotted circle) may be at least partially housed within the transfer chamber 102. The transfer robot 103 may be configured to place and extract substrates to and from various destinations via operation of robot arms (not shown) of the transfer robot 103. Substrates as used herein shall mean articles used to make electronic devices or circuit components, such as semiconductor wafers, silicon-containing wafers, patterned or un-patterned wafers, glass plates, or the like.

The motion of the various robot arm components of the transfer robot 103 may be controlled by suitable commands to a drive assembly (not shown) containing a plurality of drive motors commanded from a controller 106. Signals from the controller 106 may cause motion of the various robot arms of the transfer robot 103. Suitable feedback mechanisms may be provided for one or more of the robot arms by various sensors, such as position encoders, and the like.

The transfer robot 103 may include interconnected robot arms rotatable about a shoulder axis, which may be approximately centrally located in the transfer chamber 102. Transfer robot 103 may include a base (not shown) that is configured to be attached to a chamber wall (e.g., a chamber floor) forming a lower portion of the transfer chamber 102. However, the transfer robot 103 may be attached to a ceiling in some embodiments. The transfer robot 103 may be a dual-type robot configured to service twin chambers (e.g., side-by-side process chambers, as shown) when the processing tool includes twinned-process chambers (as shown). Other types of process chamber orientations such as radially-oriented process chambers, as well as other types of transfer robots, such as selective compliance articulating robot arm (SCARA) robots may be used.

The transfer chamber 102 in the depicted embodiment may be generally square or slightly rectangular in shape and may include a plurality of facets. The transfer robot 103 may be adept at transferring and/or retracting substrates 119 from and to process or other chambers accessible by the transfer robot 103.

The destinations for the transfer robot 103 may be one or more process chambers, such as a first process chamber set 108A, 108B, coupled to the first facet that may be configured and operable to carry out a process on the substrates delivered thereto. Further destinations for the transfer robot 103 may also be a second process chamber set 108C, 108D that may be opposed from the first process chamber set 108A, 108B. Likewise, the destinations for the transfer robot 103 may also be a third process chamber set 108E, 108F that may be opposed from a load lock apparatus 112 coupled to the third facet 102C.

The load lock apparatus 112 may include one or more load lock chambers (e.g., load lock chambers 112A, 112B, for example) therein. Load lock chambers 112A, 112B that are included in the load lock apparatus 112 may be single wafer load locks (SWLL) chambers, multi-wafer chambers, batch load lock chambers, or combinations thereof. For example, certain load locks, such as load lock 112A, may be used for flow of substrates 119 into the transfer chamber 102, while other load lock chambers, such as load lock chamber 112B, may be used for moving substrates out of the transfer chamber 102.

The various process chambers 108A-108F may be configured and operable to carry out any suitable process of the substrates 119, such as plasma vapor deposition (PVD) or chemical vapor deposition (CVD), etch, annealing, pre-clean, metal or metal oxide removal, or the like. Other deposition, removal, or cleaning processes may be carried out on substrates 119 contained therein.

Substrates 119 may be received into the transfer chamber 102 from an equipment front end module (EFEM) 114, and also exit the transfer chamber 102, to the EFEM 114, through the load lock apparatus 112 that is coupled to a surface (e.g., a rear wall) of the EFEM 114. The EFEM 114 may be any enclosure having an equipment front end module body 114B including chamber walls (such as front wall 114F, rear wall 114R, side walls 114S, and upper (ceiling) and lower (floor) walls (not labeled), for example) forming an EFEM chamber 114C. One of the side walls 114S may include an access door 114d that may be opened to gain access to the EFEM chamber 114C. One or more load ports 115 may be provided on surfaces (e.g., front wall 114F) of the EFEM body 114B and may be configured to receive one or more substrate carriers 116 (e.g., FOUPs) thereat. Three substrate carriers 116 are shown, but more or less numbers of substrate carriers 116 may be docked with the EFEM 114.

EFEM 114 may include a suitable load/unload robot 117 (only partially shown in FIG. 3B) of conventional construction within the EFEM chamber 114C thereof. The load/unload robot 117 may include an end effector 117e and may be configured and operational, once a door of a substrate carrier 116 is opened, such as by a door opener mechanism (not shown), to extract substrates 119 from the substrate carrier 116 and feed the substrates 119 through the EFEM chamber 114C and into one or more of the load lock chambers 112A, 112B of the load lock apparatus 112.

Further, the load/unload robot 117 may be configured and operational to extract substrates 119 from the load lock apparatus 112 and feed the substrates 119 into one or more side storage containers 120a, 120b of a side storage pod apparatus 120, such as after processing of the substrates 119 in one or more of the process chambers 108A-108F. In some embodiments, the load/unload robot 117 may be configured and operational to extract substrates 119 from the substrate carriers 116 and feed the substrates 119 into one or more side storage containers 120a, 120b prior to processing.

The side storage pod apparatus 120 may be coupled to the side wall 114S of the EFEM 114. The side storage pod apparatus 120 according to one feature may be environmentally controlled. For example, in some embodiments, the side storage pod apparatus 120 may contain one or more side storage containers 120a, 120b and each may include a side storage enclosure 122 defining a side storage pod chamber 123 therein that is configured to provide for storage of substrates 119.

For example, 25 or more, 50 or more, or even 75 or more, substrates 119 may be stored in each of the side storage pod chambers 123. Substrates 119 may be transferred to and from the side storage pod chambers 123 through openings 124 in side storage enclosures 122, which may couple to like opening formed in a side wall 114S of the EFEM 114. The openings 124 may remain open at all times, thus allowing unfettered access to substrates stored therein by load/unload robot. The environmental control exposes the substrates 119 stored in the side storage pod chambers 123 to a purge gas flow of a non-reactive gas at a desired flow velocity V described fully herein.

In more detail, and as shown in FIGS. 2A-3B, the side storage pod apparatus 120 of the EFEM 114 may include one or more side storage containers 120a, 120b therein. Two are shown, however, one, two, three or even four or more side storage containers may be provided. They may be stacked as shown or provided in other orientations on the side wall 114S. Each of the side storage enclosures 122 have an end surface 225 located proximate to the side wall 114S of the equipment front end module body 114B and that may be appropriately configured to couple to or interconnect to a side wall 114S of the body 114B of the EFEM 114. The coupling may be by way of a sealing member 226 surrounding the opening 124 to provide a sealed interface between the EFEM chamber 114C and the side storage pod chambers 123. Other intermediate members may facilitate coupling. Sealing member 226 may be any suitable seal, such as an O-ring seal, a rectangular seal or gasket seal, a bulb seal, and the like. The seal material may be propylene diene monomer, a fluoroelastomer, or the like. Other suitable sealing members and materials may be used.

Sealing member 226 may be compressed by a suitable number of fasteners 227 or other clamping members arranged around the opening 124. The opening 124 may be configured to be large enough to receive substrates 119 from the EFEM 114 along a height of the opening 124. For example, the opening 124 may be suitably wide (e.g., 300 mm in diameter) to receive the substrates 119 therein and may have a height that is tall enough so that the load/unload robot 117 may access each of a plurality of support members 228 (FIG. 2A) that provide vertically spaced storage locations in each of the side storage pod chambers 123. Other sizes may be used for other sized substrates 119.

Figure 2A:
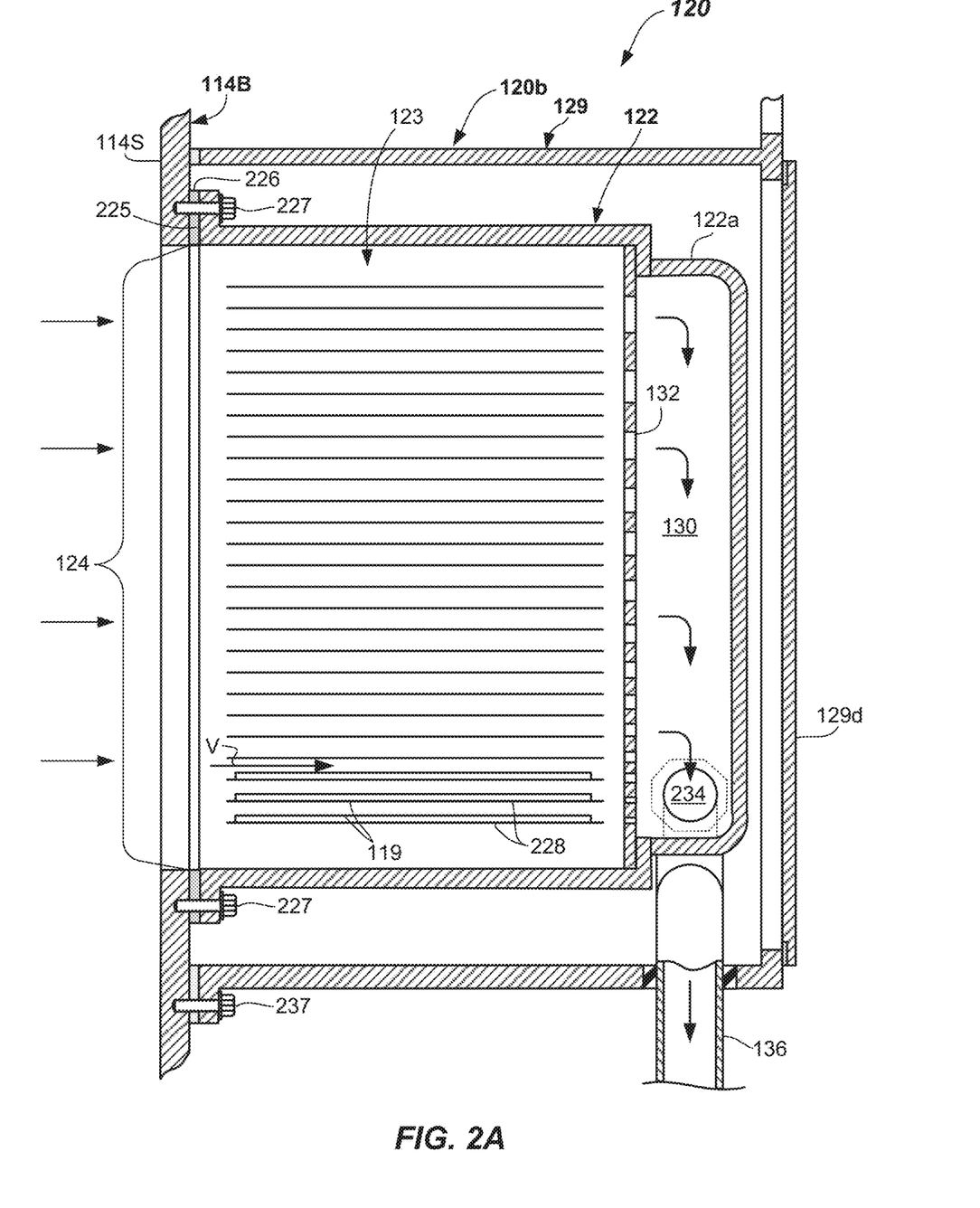
FIG. 2A illustrates cross-sectioned side view of a bottom portion of a side storage pod apparatus according to one or more embodiments of the disclosure.

The storage locations may be formed from the plurality of support members 228 that may be vertically-spaced at defined increments sufficient to allow the end effector of the load/unload robot 117 to access them, for example. The plurality of support members 228 may be spaced apart a sufficient distance to allow a robot end effector 117e (FIG. 3A) of the load/unload robot 117 to load substrates 119 onto or remove substrates 119 from the storage locations. The multiples of support members 228 may be configured to support substrates 119 horizontally thereon. For example, the support members 228 may include suitable support shelves extending laterally from each side of the side storage enclosure 122. The support members 228 may be configured to support a portion of a substrate 119, such as the edges thereof.

The side storage containers 120a, 120b of the side storage pod apparatus 120 further include a plenum chamber 130 in a rear portion thereof provided proximate to each of the side storage chambers 123. The plenum chamber 130 may be separated from the side storage pod chamber 123. The plenum chamber 130 may be provided on a rear side of the side storage enclosure 122 that is located opposite from the opening 124 to the side storage chamber 123. Plenum chamber 130 is a separate chamber from the side storage chamber 126 and may be separated by a perforated partition of any suitable configuration, such as a baffle plate 132 (to be described later herein). The circumscribed volume of the plenum chamber 130, as defined by the baffle plate 132 and the plenum walls 122a, may be much less than the volume of the side storage pod chamber 123 extending from the baffle plate 132 to a plane of the opening 124. For example, the volume of each of the plenum chambers 130 may be a small percentage of the volume of the corresponding side storage pod chamber 123.

The side storage pod apparatus 120 and each side storage container 120a, 120b further includes an exhaust port 234 that is coupled to the plenum chamber 130 and is configured to exhaust purge gas from the plenum chamber 130 through an exhaust conduit 136. Exhaust conduit 136 may exit external to the EFEM 100. Exhaust conduits 136 may be coupled to any suitable exhaust treatment apparatus 150 for treating the exhaust effluent, such as a chemical filter, a scrubber, or other like functioning member configured to process the exhausted effluent gas carried by the exhaust conduits 136.

As shown, the side storage enclosures 122 may be enclosed entirely within a retaining enclosure 129, which may also be coupled and sealed to the EFEM wall 114S by any suitable means, such as a gasket, O-ring, or other seal and suitable clamping means such as retaining fasteners 237 (FIG. 2A) received through a flange thereof. Other clamping means may be used.

Figure 2B:
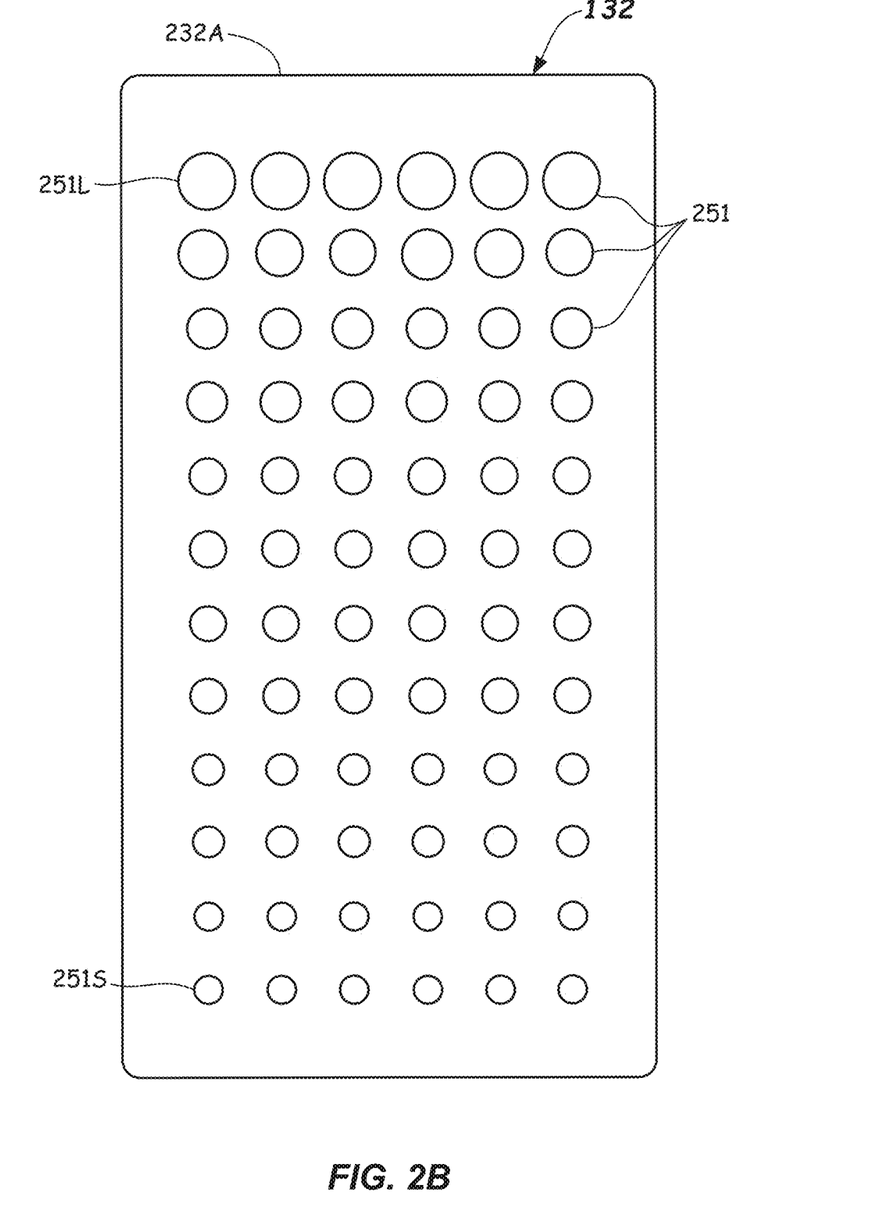
FIG. 2B illustrates front plan view of a separating member comprising a baffle plate of a side storage pod apparatus according to one or more embodiments of the disclosure.
Figure 2C:
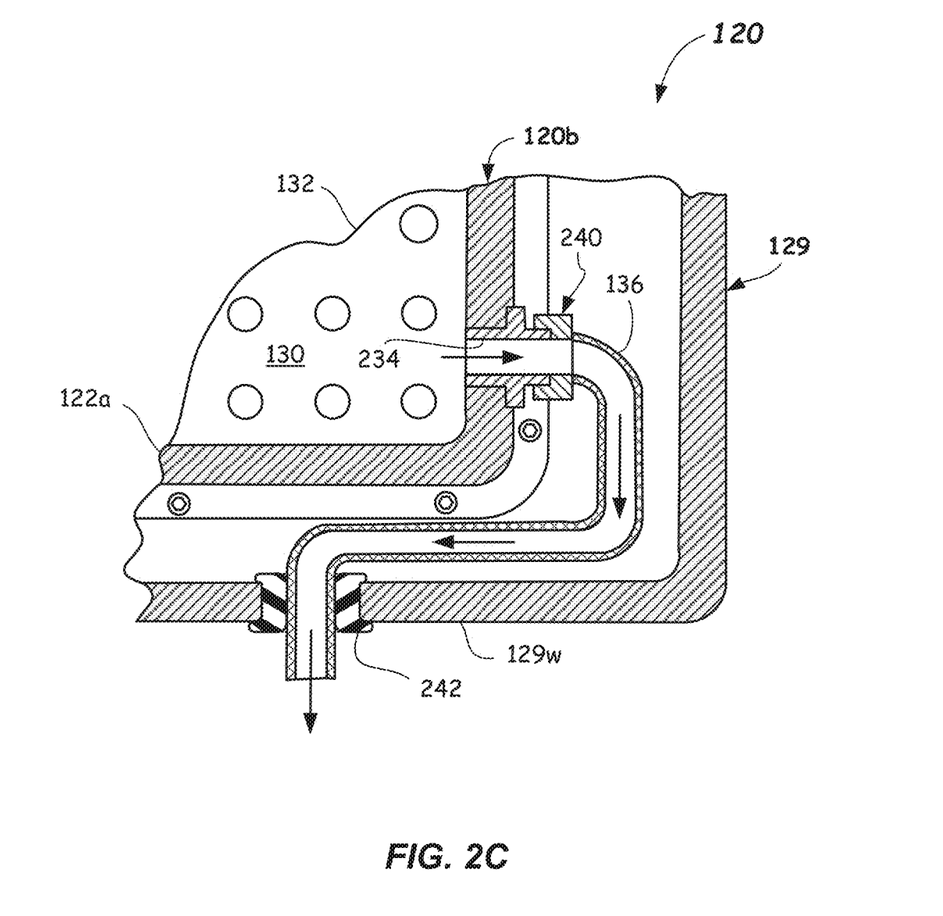
FIG. 2C illustrates cross-sectioned partial rear view an exhaust of a side storage pod apparatus according to one or more embodiments of the disclosure.

As best shown in the partial cross-sectional view of the side storage pod apparatus 120 shown in FIG. 2C, the exhaust conduit 136 may include along its length a quick disconnect coupling 240 that is configured to allow rapid disconnection of the exhaust conduit 136 between the plenum wall 122a and the retaining wall 129w of the retaining enclosure 129. For example, the quick disconnect coupling 240 may have a first stationary part that is attached to a side of the side storage enclosure 122 and a second part of the quick disconnect coupling 240 may be attached to the exhaust conduit 136, which may be a flexible (e.g., braided or accordion type) conduit, for example. Thus, the exhaust conduit 136 may be quickly disconnected allowing the side storage enclosure 122 to be disconnected from the exhaust port 234 coupled to the plenum chamber 130.

This allows the side storage enclosure 122 to be removed for service (e.g., for cleaning and/or other maintenance). Exhaust conduit 136 passes through the retaining wall 129w of the retaining enclosure 129 by any suitable means. For example, the passage of the exhaust conduit 136 through the retaining wall 129w of the retaining enclosure 129 may be by a sealed connection that is sealed by any suitable means, such as a sealing member 242. Sealing member 242 may be a grommet or other sealed connector. Optionally, the conduit 136 may couple to a pass through that may be constituted of a short tube formed, welded, or otherwise sealed into the wall 129w that is then coupled to sections of the conduit 136 on opposite sides of the retaining wall 129w. Optionally, a quick disconnect coupling like coupling 240 may be attached at the retaining wall 129w of the retaining enclosure 129. The exhaust port 234 may be coupled proximate to a bottom portion of the plenum chamber 130 as shown or elsewhere along the lateral sides, top or bottom, or rear wall of the plenum chamber 130.

In one or more embodiments, a non-reactive gas such as nitrogen may be supplied to the EFEM 114, for example. The non-reactive gas may flow through the side storage pod chambers 123 so that any substrates 119 stored therein may be exposed to a non-reactive environment. The exposure to the non-reactive gas flow may prevent or reduce exposure to contaminants or other unwanted conditions (e.g., high humidity levels) and may, when a sufficient flow velocity V is present, cause the degassing of certain unwanted chemical components from the surface of the substrates 119. For example, the unwanted chemical components may be one or more of a bromine-containing component, a chlorine-containing component, fluorine-containing component, and the like. These unwanted chemical components may be disassociated and removed from the surface of the substrates 119 as a result of a suitable flow velocity V of purge gas flow. The velocity V of purge gas flow through each of the side storage containers 120a, 120b may be as discussed above, for example. Too small of velocity V may not effectively disassociate the unwanted chemical components. If the flow velocity V is too large then large pressures, high operational cost, and uneven or non-laminar flow through the side storage pod may result.

Referring now to FIG. 1 and FIG. 3A-3B, the EFEM chamber 114C may be provided with environmental control system 118 providing an environmentally-controlled atmosphere to the EFEM chamber 114C. In particular, the environmental control system 118 is coupled to the EFEM 114 and is operational to monitor and/or control environmental conditions within the EFEM chamber 114C. In some embodiments, and at certain times, the EFEM chamber 114C may receive a non-reactive gas therein, such as during processing of substrates 119. The non-reactive gas may be an inert gas such as Argon (Ar), Nitrogen ($N_2$), or helium (He) and may be provided from a purge gas supply 118S. Optionally or additionally, the purge gas supply 118S may include clean dry air with less than 5% relative humidity (RH) at room temperature (RT), for example.

Purge gas supply 118S may be coupled through a control valve 118V to an upper plenum 344 of the EFEM 114. In this manner, a flow of the non-reactive gas (hereinafter purge gas) may flow from the upper plenum 344 to the EFEM chamber 114C through the one or more filters, which may be a chemical filter 345, a particle filter 346, or both.

The chemical filter 345 may be a sheet containing an activated carbon, and may be used to filter certain unwanted chemical contaminants from the recirculating gas flow to a desired low concentration. The chemical contaminants filtered from the recirculating gas flow by the chemical filter 345 may be base-forming gases, such as $NH_3$ and may be filtered to provide desired concentrations, for example. The chemical contaminants filtered from the recirculating gas flow can be certain acid-forming gases such as F, Cl, Br, Oac, $NO_2$, $NO_3$, $PO_4$, HF, HCL and may be filtered to desired concentrations, for example. The chemical filter 345 may be used to remove the chemical contaminants from the flow stream to less than or equal to 100 ppb, or even less than or equal to 10 ppb for acid-forming gases.

Optionally, the flow path from the upper plenum 344 may include flow through a homogenation plate 347 configured to provide substantially uniform purge gas flow into the EFEM chamber 114C. The homogenation plate 347 may include a plurality of holes therein that are sized to substantially equalize flow velocity at all locations exiting from the homogenation plate 347 into the EFEM chamber 114C. From there, some of the purge gas flow enters into the one or more side storage pod chambers 123 of the side storage pod apparatus 120. The remainder of the gas flow is recirculated to the upper plenum 344. The recirculating gas flow may exit the EFEM chamber 114C at a bottom portion thereof, such as through a plurality return ports 321. The recirculation path may be through a channel 357 formed in the access door 124d. Other suitable recirculation paths may be provided.

In the depicted embodiment of FIG. 3A, two side storage containers 120a, 120b including side storage enclosures 122 are provided, and are arranged one above the other. However, other suitable orientations are possible, such as side-by-side, space allowing.

The purge gas flow passes over, under and between the substrates 119 as it passes through the one or more side storage pod chambers 123 and then passes through the baffle plates 132 and into the respective plenum chambers 130. The purge gas flow is then exhausted through the exhaust port 234 through exhaust conduit 136. Exhaust conduit 136 may be of any suitable construction. The exhaust gas may further flow to any suitable exhaust treatment apparatus 150.

The one or more baffle plates 132 separate the one or more plenum chambers 130 from the one or more side storage chambers 123 that contain the substrates 119 therein. In particular, as best shown in a plan view in FIG. 2B, the baffle plate 132 may include a configuration adapted to cause substantial gas flow uniformity through each of the one or more side storage chambers 123, and thus substantial gas flow uniformity may be provided across the substrates 119 contained therein. The term "substantial gas flow uniformity" as used herein means the flow velocity V (FIG. 2A) in each of the one or more side storage chambers 123 across each of the storage locations supporting vertically-arranged substrates 119 contained in the one or more side storage chambers 123 varies by no more than 25%, but may vary less than 15%. Thus, each of the substrates 119 may be exposed to a suitable gas flow velocity such that unwanted chemical contaminants may be disassociated therefrom. The gas flow velocity V enabling disassociation of the unwanted chemical contaminants from the surfaces of the substrates 119 may be as discussed above. For disassociation of the unwanted chemical contaminants, the gas flow velocity V should be in a range from greater than or equal to 100 cfm to less than or equal to 200 cfm, or even from greater than or equal to 150 cfm to less than or equal to 200 cfm.

The substantial gas flow uniformity may be provided by forming a series of flow passages 251 (a few labeled) through the baffle plate 132. At least some of the flow passages 251 have a different cross-sectional area as compared to other ones of the flow passages 251. For example, in one embodiment, the flow passages 251 may define or include a set of relatively larger flow passages 251L at one vertical portion of the baffle plate 132 and a set of relatively smaller flow passages 251S at another vertical portion of the baffle plate 132.

In the depicted embodiment, the relatively larger flow passages 251L, i.e., those having relatively large cross-sectional areas, are located towards one end 232A (e.g., a top end of the plenum chamber 130 as shown) of the baffle plate 132. For example, the relatively larger flow passages 251L may be positioned vertically away from the location of the exhaust port 234 in the plenum chamber 130. The exhaust port 234 in the depicted embodiment is positioned proximate to a bottom end of the plenum chamber 130, and thus the relatively larger flow passages 251L are provided proximate the upper end 232A of the baffle plate 132.

However, in some embodiments, the exhaust port 234 may be located between the upper and lower ends of the plenum chamber 130. In this configuration, the relatively larger flow passages 251L may be provided at both the upper and lower ends of the baffle plate 132 and the relatively smaller passages 251S would be located at a vertical location proximate to the location of the exhaust port 234.

Thus, it should be understood that some environmental conditions existing within the EFEM chamber 114C may be provided in the one or more side storage chambers 123 of the side storage pod 120. To ensure that a suitable flow velocity V of the purge gas in the one or more side storage pod chambers 123 of the side storage pod apparatus 120 is provided, the exhaust ports 234 or the exhaust conduits 136 may connect or interconnect to, or include, a flow assist such as a supplemental fan 152 for supplementing the gas flow through the one or more side storage chambers 123. The flow assist from the supplemental fan 152 may be located anywhere along the exhaust conduit 136 and may be part of the exhaust treatment apparatus 150 in some embodiments.

In more detail, the environmental control system 118 may control at least one of: 1) relative humidity (RH), 2) temperature (T), 3) an amount of $O_2$, or 4) an amount of inert and/or non-reactive gas, within the EFEM chamber 114C, and/or side storage pod chamber 123. Other environmental conditions of the EFEM 114, side storage pod chamber 123 may be monitored and/or controlled, such as gas flow velocity into or through the EFEM chamber 114C and/or gas flow velocity V in the side storage pod chamber 123, or pressure in the EFEM chamber 114C, the side storage pod chamber 123, or both.

In some embodiments, environmental control system 118 includes a controller 106. Controller 106 may include suitable processor, memory, and/or electronic components for receiving inputs from various sensors (e.g., sensor(s) 128) and controlling one or more valves or other components (e.g., supplemental fans 152, recirculation fan(s) 354) to control the environmental conditions existing within the EFEM chamber 114C and/or the one or more side storage pod chambers 123.

Environmental control system 118 may, in one or more embodiments, monitor relative humidity (RH) by sensing RH in the EFEM 114C with a sensor 128 (e.g., a relative humidity sensor) that is configured to sense relative humidity (RH). Any suitable type of relative humidity sensor may be used, such as a capacitive-type sensor. Relative humidity in the side storage pod 120 may also be monitored, such as by providing a suitable sensor (not shown) in the side storage pod chamber 123, plenum chamber 130, or exhaust conduit 136. The RH may be lowered by flowing a suitable amount of an inert and/or non-reactive gas from the purge gas supply 118S of the environmental control system 118 into the EFEM chamber 114C through the inlet port 355.

As described herein, the inert and/or non-reactive gas from the purge gas supply 118S may be argon, $N_2$, helium, another non-reactive gas such as clean dry air, or mixtures thereof. Compressed bulk gases having low $H_2O$ levels (e.g., purity≥99.9995%, $H_2O$≤5 ppm) may be used as the purge gas supply 118S in the environmental control system 118, for example. Other $H_2O$ levels, such as less than or equal to 5% RH may be used.

In one or more embodiments, by another measure, the pre-defined reference humidity value may be less than about 1,000 ppm moisture, less than about 500 ppm moisture, or even less than about 100 ppm moisture, depending upon the level of moisture that is tolerable for the particular process being carried out in the electronic device processing assembly 100 or particular substrates 119 exposed to the environment of the EFEM 114 and side storage pod chamber 121.

The environmental control system 118 may include a sensor 128 such as an oxygen sensor that is configured and adapted to sense a level of oxygen ($O_2$) within the EFEM 114. Oxygen level in the side storage pod chamber 121, plenum chamber 130, or exhaust conduit 136 also may be monitored. In some embodiments, a control signal from the controller 106 to the environmental control system 118 initiating a flow of a suitable amount of an inert and/or non-reactive gas from the purge gas supply 118S into the EFEM chamber 114C through inlet port 355 may take place to control the level of oxygen ($O_2$) to below a threshold $O_2$ value. In one or more embodiments, the threshold $O_2$ value may be less than about 10 ppm of $O_2$, less than about 10 ppm of $O_2$, or even less than about 5 ppm of $O_2$, depending upon the level of $O_2$ that is tolerable (not affecting quality) for the particular process being carried out in the electronic device processing system 100 or particular substrates exposed to the environment of the EFEM 114, side storage pod 120 and/or side storage pod chamber 121. Other threshold $O_2$ values may be used. In some embodiments, the sensor 128 (e.g., oxygen sensor) may sense the level of oxygen in the EFEM chamber 114C to ensure it is above a safe threshold level to allow entry into the EFEM chamber 114C (e.g., by a technician during maintenance).

The environmental control system 118 may further include a pressure sensor 133 that measures the absolute or relative pressure within the EFEM chamber 114C. Pressure level in the side storage pod chamber 123, plenum chamber 130, or exhaust conduit 136 also may be monitored. In some embodiments, the controller 106 may control the amount of flow of an inert and/or non-reactive gas from the purge gas supply 118S into the EFEM chamber 114C and/or side storage pod chamber 121 to control the pressure in the EFEM chamber 114C, side storage pod chamber 123, plenum chamber 130, or exhaust conduit 136.

In the depicted embodiments herein, the controller 106 may be any suitable controller having suitable processor, memory, and peripheral components adapted to receive control inputs from the various sensor(s) 128 and execute a closed loop or other suitable control scheme. In one embodiment, the control scheme may change a flow rate of the purge gas being introduced into the EFEM 114 through the inlet port 355 via valve 118V together with control settings for the supplemental fans 152, recirculation fan(s) 354, and the base valve 356 to achieve a desired environmental conditions in the EFEM chamber 114C, side storage pod chamber 123, plenum chamber 130, or exhaust conduit 136 together with a desired exchange rate and recirculation rate of gas from the EFEM chamber 114C. In some embodiments, the recirculation rate, i.e., the recirculation rate (RR) from the EFEM chamber 114c through the recirculation channel 357 may be greater than or equal to 1000 cfm. RR is controlled by the control setting of recirculation fan(s) 354.

The exchange rate (ER), i.e., the rate of removal of purge gas from the EFEM chamber 114C may be small, such as less than or equal to 200 liters/min, taking into account the amount of gas removed through base valve 356 together with the amount of gas exhausted through the exhaust conduits 136. In some case, the base valve may be eliminated.

In another embodiment, the control scheme may determine when to transfer substrates into the EFEM 114 and/or side storage pod chamber 123. In some embodiments, the side storage pod chamber 123 may use a separate controller and/or sensor(s) to monitor the side storage pod chamber 123, plenum chamber 130, and/or exhaust conduit 136 and control the environment within the side storage pod chamber 123.

Thus, the side storage pod 120 attached to the body of the EFEM 114 may store substrates 119 under specific environmental conditions. For example, the side storage pod chamber 123 may store the substrates 119 at the same environmental conditions (RH, $O_2$, and temperature) that are present in the EFEM chamber 114C. Alternatively, the side storage pod chamber 123 may employ environmental conditions that are different than that of the EFEM chamber 114C for substrate storage (e.g., higher flow velocity V).

In some embodiments, a heater (not shown) may be used to heat the gas flow before entry into the side storage pod chamber 123, for example. In some embodiments, the heater may be provided in the EFEM chamber 114c or in the upper plenum chamber 344, or the gas entering from the inlet port 355 may be heated. Heating may result in a gas flow temperature within the side storage pod chamber 123 of greater than or equal to 5° C., greater than or equal to 10° C., or even 5° C. to 25° C., for example.

In operation, side storage pod containers 120a, 120b may be loaded into or removed from the retaining enclosure 129 through access door 129d. This allows for easy maintenance and cleaning of side storage pod chamber 123 and the ability to quickly add a new or cleaned side storage container 120a, 120b therein.

Access door 129d and retaining enclosure 129 may configured to provide a sealed environment surrounding the side storage containers 120a, 120b. Side storage pod containers 120a, 120b are fixed in location to the EFEM side wall 114B, and the opening 124 remains open enabling substrates 119 to be loaded into or removed from the side storage pod chamber 123 by the load/unload robot 117 as commanded.

In some embodiments, load/unload robot 117 may include vertical motion capability to enable vertical alignment of the end effector 117e with any of the storage locations within the side storage pod chamber 123.

Figure 4:
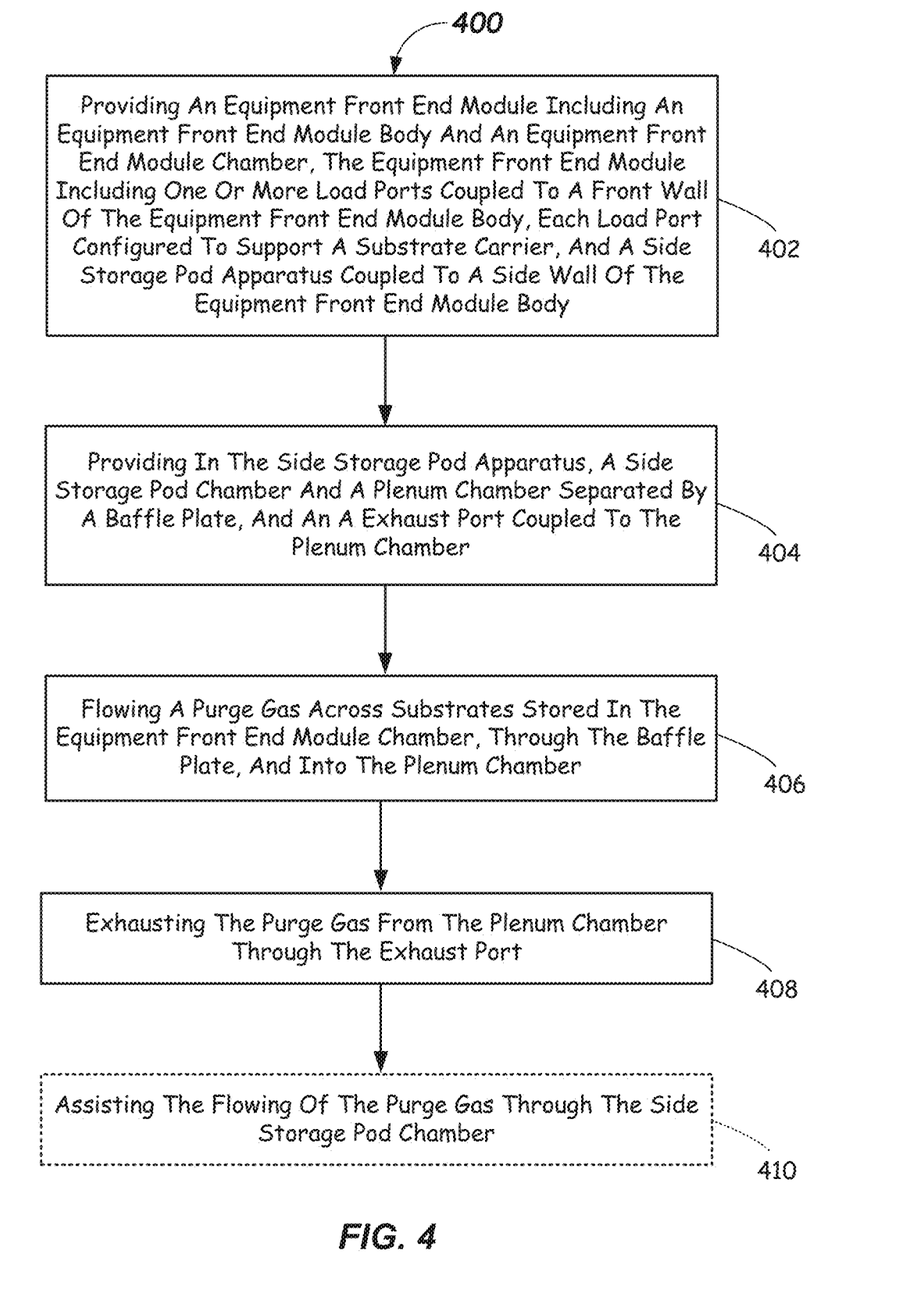
FIG. 4 illustrates a flowchart depicting a method of purging an EFEM including a side storage pod assembly according to one or more embodiments.

FIG. 4 illustrates a method 400 of processing substrates 119, such as within a side storage pod apparatus 120 of an EFEM 114 and within an electronic device processing assembly 100 in accordance with embodiments provided herein. With reference to FIG. 4, in block 402, method 400 includes providing an equipment front end module 114 including an equipment front end module body 114B and an equipment front end module chamber 114C, the equipment front end module 114 including one or more load ports 115 coupled to a front wall 114F of the equipment front end module body 114B, each load port 115 configured to support a substrate carrier 116, and a side storage pod apparatus 120 coupled to a side wall 114S of the equipment front end module body 114B.

The method 400 further includes, in block 404, providing in the side storage pod apparatus 120, a side storage pod chamber 123 and a plenum chamber 130 separated by a baffle plate 132, and an exhaust port 234 coupled to the plenum chamber 130.

The method 400 further includes, in block 406, flowing a purge gas (e.g., a non-reactive or inert gas) across substrates 119 stored in the equipment front end module chamber 123, through the baffle plate 132, and into the plenum chamber 130, and in block 408, exhausting the purge gas from the plenum chamber 130 through the exhaust port 234. The exhaust exits the side storage pod apparatus 120 through one or more exhaust conduits 136 thereof and is not recirculated thereto or otherwise returned to the EFEM chamber 114C, but may be routed to an exhaust treatment apparatus 150 where it may be appropriately treated.

The method 400 may further include, in block 410, assisting the flowing of the purge gas through the side storage pod chamber 123, such as with a supplemental fan 352. The flow assist may supplement and increase the flow velocity V to a desired level across the substrates 119 to enable effective disassociation of chemical contaminants therefrom.

The flowing of the purge gas across the substrates 119 may include a gas flow velocity V of greater than or equal to 100 cfm, greater than or equal to 140 cfm, or even greater than or equal to 160 cfm. Flow velocity V of greater than or equal to 100 cfm and less than or equal to 200 cfm have been found to be acceptable for disassociation of chemical contaminants such as halogen-containing components from the substrates 119.

The side storage pod chamber 123 may store a plurality of substrates 119 therein, and the gas flow velocity V may be substantially uniform over each of the plurality of substrates 119 contained in the side storage pod chamber 123. Differing dimensions of perforations in the baffle plate 132 may be used to cause the substantially uniform gas flow. For example, gas flow through the EFEM chamber 114C, side storage pod chamber 123, baffle plate 132, and plenum chamber 130 and exit through the exhaust port 234 may be modeled and experimentally tested to derive a suitable perforation structure and pattern for the baffle plate 132.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A side storage pod apparatus of an equipment front end module, comprising:
   a side storage enclosure having a surface configured to couple to a side wall of a body of the equipment front end module, and an opening configured to receive substrates from the equipment front end module and to receive a flow of purge gas from the equipment front end module;
   a side storage chamber within the side storage enclosure having a plurality of support members configured to support substrates thereon;
   a plenum chamber provided proximate the side storage chamber, the plenum chamber being a separate chamber from the side storage chamber; and
   an exhaust port coupled to the plenum chamber and to an exhaust conduit that sends the purge gas to an exhaust treatment scrubber.

2. The side storage pod apparatus of claim 1, wherein the plenum chamber is positioned on a side of the side storage enclosure opposite from the opening.

3. The side storage pod apparatus of claim 1, wherein the plenum chamber is separated from the side storage chamber by a baffle plate.

4. The side storage pod apparatus of claim 3, wherein the baffle plate is adapted to cause substantial gas flow uniformity through the side storage chamber.

5. The side storage pod apparatus of claim 3, further comprising a series of flow passages formed through the baffle plate.

6. The side storage pod apparatus of claim 5, wherein at least some of the series of flow passages have a different cross-sectional area.

7. The side storage pod apparatus of claim 5, wherein the series of flow passages comprises a set of larger flow passages positioned at one vertical portion of the baffle plate and a set of smaller flow passages positioned at another vertical portion of the baffle plate.

8. The side storage pod apparatus of claim 7, wherein the set of larger flow passages are located towards one end of the baffle plate.

9. The side storage pod apparatus of claim 7, wherein the set of larger flow passages are positioned vertically away from the exhaust port.

10. The side storage pod apparatus of claim 1, wherein the exhaust port is coupled to a bottom portion of the plenum chamber.

11. The side storage pod apparatus of claim 1, further comprising a baffle plate to separate the plenum chamber from the side storage chamber, wherein the baffle plate comprises a series of flow passages having different cross-sectional areas through the baffle plate, the series of flow passages including a set of larger flow passages located proximate a top end of the plenum chamber and a set of smaller flow passages located proximate a bottom end of the plenum chamber.

12. The side storage pod apparatus of claim 1, further comprising a retaining enclosure surrounding the side storage enclosure.

13. The side storage pod apparatus of claim 12, further comprising an exhaust conduit coupled to the exhaust port, and the exhaust conduit passes through a wall of the retaining enclosure.

14. The side storage pod apparatus of claim 1, further comprising a supplemental fan coupled to the exhaust port or an exhaust conduit coupled to the exhaust port.

15. The side storage pod apparatus of claim 1, further comprising:
   the exhaust conduit; and
   the exhaust treatment scrubber attached to the exhaust conduit, wherein the exhaust treatment scrubber comprises a chemical filter.

16. An equipment front end module, comprising:
   an equipment front end body; and
   a side storage pod apparatus coupled to a side wall of the equipment front end body, the side storage pod apparatus, further comprising:
   a side storage pod enclosure having a surface configured to couple to a side wall of the equipment front end body,
   an opening to receive substrates from the equipment front end module and to receive a flow of purge gas from the equipment front end module,
   a side storage pod chamber within the side storage enclosure having a plurality of vertically-spaced storage members each configured to support a substrate,
   a plenum chamber within the side storage enclosure comprising a separate chamber from the side storage pod chamber,
   a baffle plate configured to separate the plenum chamber from the side storage pod chamber, and
   an exhaust port coupled to the plenum chamber and to an exhaust conduit that sends the gas to an exhaust treatment scrubber.

17. An electronic device processing assembly, comprising:
   an equipment front end module, including:
   an equipment front end module body forming an equipment front end module chamber;
   one or more load ports coupled to a front wall of the equipment front end module body, each load port configured to dock a substrate carrier thereat; and
   a side storage pod apparatus coupled to a side wall of the equipment front end module body, the side storage pod apparatus comprising:
   a side storage enclosure defining walls of a side storage pod chamber, and having a sealing surface configured to couple to the equipment front end module body, the walls including a plurality of vertically-spaced support members configured to support substrate thereon;
   an opening to receive substrates from the equipment front end module and to receive a flow of purge gas from the equipment front end module;
   a plenum chamber within the side storage enclosure comprising a separate chamber from the side storage pod chamber;
   a baffle plate configured to separate the plenum chamber from the side storage pod chamber;
   an exhaust port;

an exhaust conduit coupled to the exhaust port, the exhaust conduit to send the gas to an exhaust treatment scrubber; and a supplemental fan coupled to the exhaust port or the exhaust conduit.

18. The electronic device processing assembly of claim 17, further comprising an environmental control system coupled to the equipment front end module chamber, the environmental control system to provide an environmentally-controlled atmosphere to the equipment front end module chamber.

19. A method of processing substrates, comprising:

providing an equipment front end module including an equipment front end module body and an equipment front end module chamber, the equipment front end module including one or more load ports coupled to a front wall of the equipment front end module body, each load port configured to support a substrate carrier, and a side storage pod apparatus coupled to a side wall of the equipment front end module body;

providing, in the side storage pod apparatus, a side storage pod chamber and a plenum chamber separated by a baffle plate, and an exhaust port coupled to the plenum chamber;

flowing, from the equipment front end module through the baffle plate and into the plenum chamber, a purge gas across substrates stored in the side storage pod chamber;

exhausting the purge gas from the plenum chamber through the exhaust port; and sending the purge gas to an exhaust treatment scrubber.

20. The method of claim 19, further comprising assisting the purge gas flowing through the side storage pod chamber with a supplemental fan.

21. The method of claim 19, wherein the flowing of the purge gas across the substrates comprises a gas flow velocity of greater than or equal to 100 cubic feet per minute (cfm).

22. The method of claim 21, wherein the gas flow velocity is greater than or equal to 140 cfm.

23. The method of claim 21, wherein the gas flow velocity is greater than or equal to 160 cfm.

24. The method of claim 21, wherein the gas flow velocity is greater than or equal to 100 cfm and less than or equal to 200 cfm.

25. The method of claim 19, wherein the side storage pod chamber comprises a plurality of substrates, the method further comprising causing a gas flow velocity to be substantially uniform over each of the plurality of substrates contained in the side storage pod chamber.

* * * * *